(12) United States Patent
Urban

(10) Patent No.: US 8,223,993 B2
(45) Date of Patent: Jul. 17, 2012

(54) SIGNAL CONDITIONER FOR SUBWOOFERS

(75) Inventor: Frank J Urban, Arlington Heights, IL (US)

(73) Assignee: U.S. SoundLabs Inc., Arlington Heights, IL (US)

( * ) Notice: Subject to any disclaimer, the term of this patent is extended or adjusted under 35 U.S.C. 154(b) by 221 days.

(21) Appl. No.: 12/823,393

(22) Filed: Jun. 25, 2010

(65) Prior Publication Data

US 2011/0317849 A1    Dec. 29, 2011

(51) Int. Cl.
*H03G 5/00*    (2006.01)
*H03G 3/00*    (2006.01)
*H04R 5/00*    (2006.01)

(52) U.S. Cl. ............... 381/98; 381/27; 381/61

(58) Field of Classification Search ............ 381/27, 381/98, 99–103, 61, 106, 120
See application file for complete search history.

(56) References Cited

U.S. PATENT DOCUMENTS 7,136,493 B2 *  11/2006  Coats et al. ............... 381/61

* cited by examiner

*Primary Examiner* — Vivian Chin
*Assistant Examiner* — Douglas Suthers
(74) *Attorney, Agent, or Firm* — Greer, Burns & Crain, Ltd.

(57) ABSTRACT

A signal conditioner for subwoofers has a band pass filter which passes a lower frequency spectrum of an input signal. The band pass filter includes a high pass filter having a predetermined corner frequency, and a low pass filter having about the same corner frequency, and produces a filtered input to a peak voltage follower circuit. The peak voltage follower circuit traces and smoothes the upper boundary of the filtered input to produce a control voltage. An analog multiplier multiplies the input signal by the control voltage produced by the peak voltage follower to produce an enhanced signal where low frequency transients have been magnified.

7 Claims, 7 Drawing Sheets

SIGNAL CONDITIONER FOR SUBWOOFERS

This invention relates to signal conditioners, and more particularly, to signal conditioners for subwoofers in audio reproduction systems.

BACKGROUND OF THE INVENTION

In the field of sound system engineering, bass content is generally the most difficult to reproduce with sufficient volume because of the nature of how humans hear low frequencies. People hear bass notes ever more softly as the frequency decreases. Subwoofers are typically used to overcome this problem. However, when low-pitched percussion instruments are electronically reproduced by subwoofers, their sharp transients get smeared by extreme low-pass filtering. For these reasons, and because of the methods used to mix and master a recording, these instruments can sound noticeably artificial.

Accordingly, one object of this invention is to provide improved signal conditioners.

Another object is to provide improved signal conditioners for subwoofers.

Another object is to provide improved methods for the reproduction of low-pitched percussion instruments from an audio source.

SUMMARY OF THE INVENTION

In keeping with one aspect of this invention, a signal conditioner includes a band pass filter that passes a lower frequency spectrum of an input signal from a tuner or an audio amplifier. The band pass filter includes a high pass filter having a predetermined corner frequency, and a low pass filter having about the same corner frequency. The band pass filter produces a filtered input to a peak voltage follower circuit. The peak voltage follower circuit traces and smoothes the upper boundary of the filtered input to produce a control voltage, and an analog multiplier multiplies the input signal by the control voltage produced by the peak voltage follower. The output of the multiplier represents an enhanced signal where the low frequency transients have been magnified. The output is fed to a powered subwoofer having a low pass filter, an amplifier and at least one speaker for sound reproduction.

BRIEF DESCRIPTION OF THE DRAWINGS

The above mentioned and other features of this invention and the manner of obtaining them will become more apparent, and the invention itself will be best understood by reference to the following description of embodiments of the invention taken in conjunction with the accompanying drawings, in which:

FIG. 2b is a schematic diagram of an alternate embodiment of the signal conditioner of FIG. 2a;

FIG. 3 is a graph of the characteristics and output of the band pass filter of FIG. 2a;

FIG. 4 is a graph of an input signal to the peak voltage follower of FIG. 2a;

FIG. 5 is a graph of the control voltage produced by the peak voltage follower and voltage smoothing circuit of FIG. 2a;

FIG. 6a is an illustration of an input signal to the signal conditioner of FIG. 2a; and FIG. 6b is an illustration of output signal of the signal conditioner of FIG. 2a.

DETAILED DESCRIPTION

Figure 1:
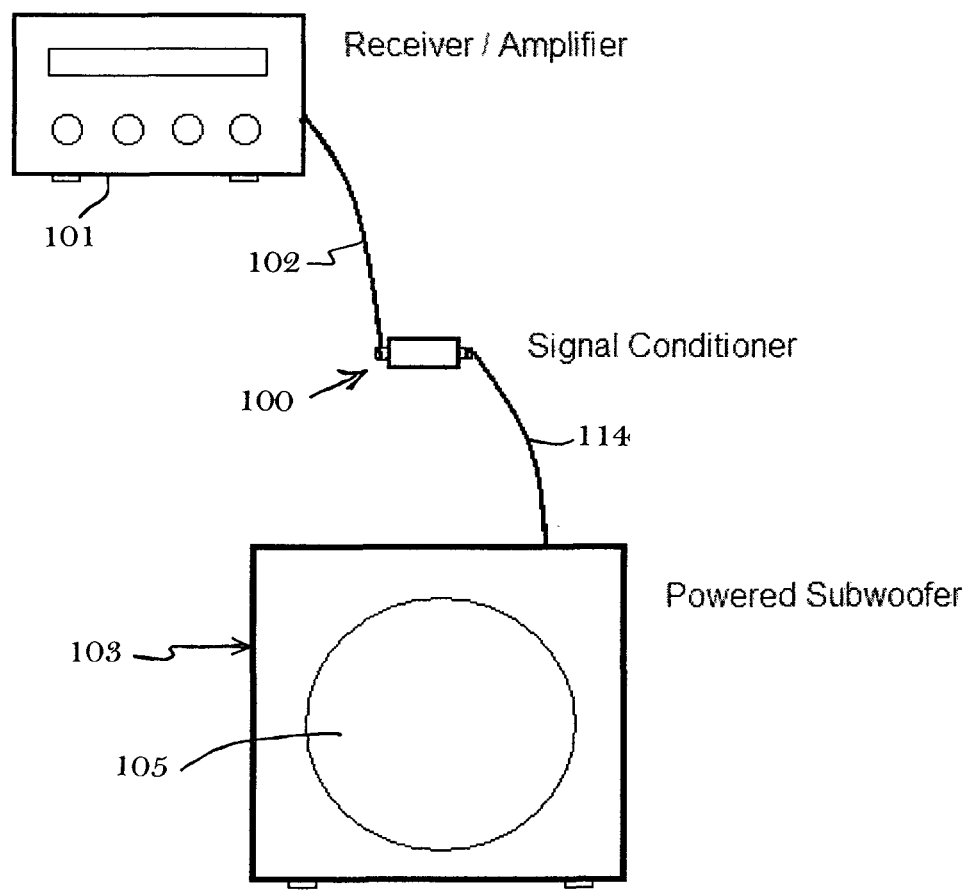
FIG. 1 is a block diagram of a signal conditioner in an audio reproduction system.

As seen in FIG. 1, a signal conditioner 100 receives an input 102 from the audio output of a receiver or amplifier 101. The amplifier is an electronic device that reproduces prerecorded music or other content from a compact disk, DVD, cable, Internet, or other source. The amplifier output can be a dedicated low-frequency output or a general output of music or other content.

A conditioned output 114 of the signal conditioner 100 is fed to a powered subwoofer 103, which typically has a low-pass filter (not shown), an audio amplifier (not shown) and a speaker 105. The speaker 105 reproduces the music.

Figure 2A:
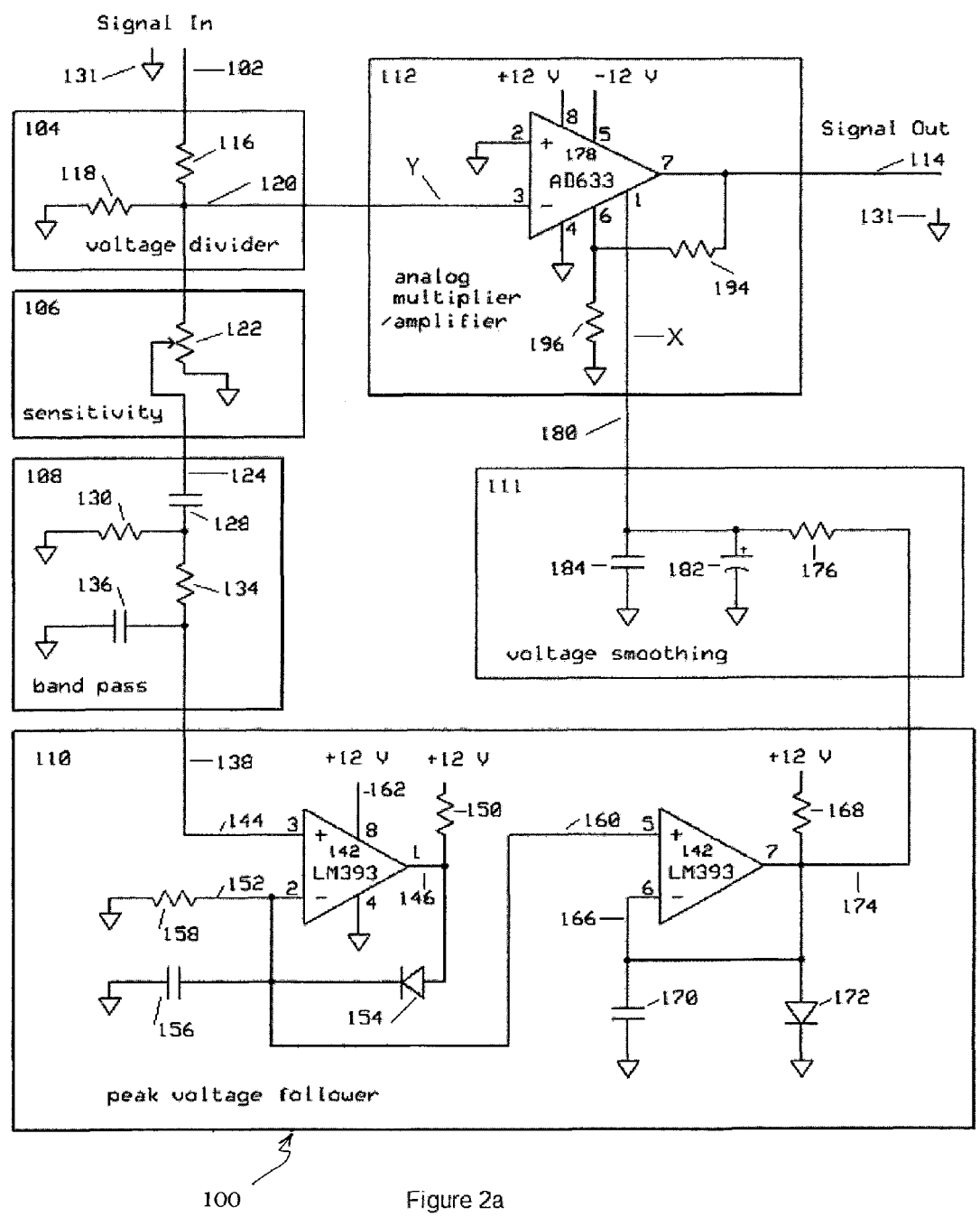
FIG. 2a is a schematic diagram of one embodiment of a signal conditioner made according to the present invention.

Referring now to FIG. 2a, the filter 100 includes the input terminal 102, a voltage divider 104, a sensitivity control 106, a band pass filter 108, a positive peak voltage follower circuit 110, an optional voltage smoothing circuit 111, an analog multiplier and amplifier 112, and the output terminal 114.

The voltage divider 104 includes resistors 116, 118, and produces a divided output 120. The output 120 is provided to sensitivity control circuit 106, which can be a potentiometer 122 that is adjusted by the operator or listener. An output 124 of the sensitivity control circuit 106 is provided as an input to the band pass filter 108.

The filter 108 includes a high-pass filter having a capacitor 128 and a resistor 130. The capacitor 128 is connected in series with a signal line 138, and the resistor 130 is connected between the signal line 138 and a ground 131. The high pass filter has an attenuation curve 133 in FIG. 3. The output of the high pass filter has a corner 135 at which the output is down 3 dB from its peak output. A typical corner might be 60 Hz.

The filter 108 also has a low pass filter having a resistor 134 and a capacitor 136. The resistor 134 is connected in series, and the capacitor 136 is connected between the signal line 138 and the ground connection 131.

Figure 3:
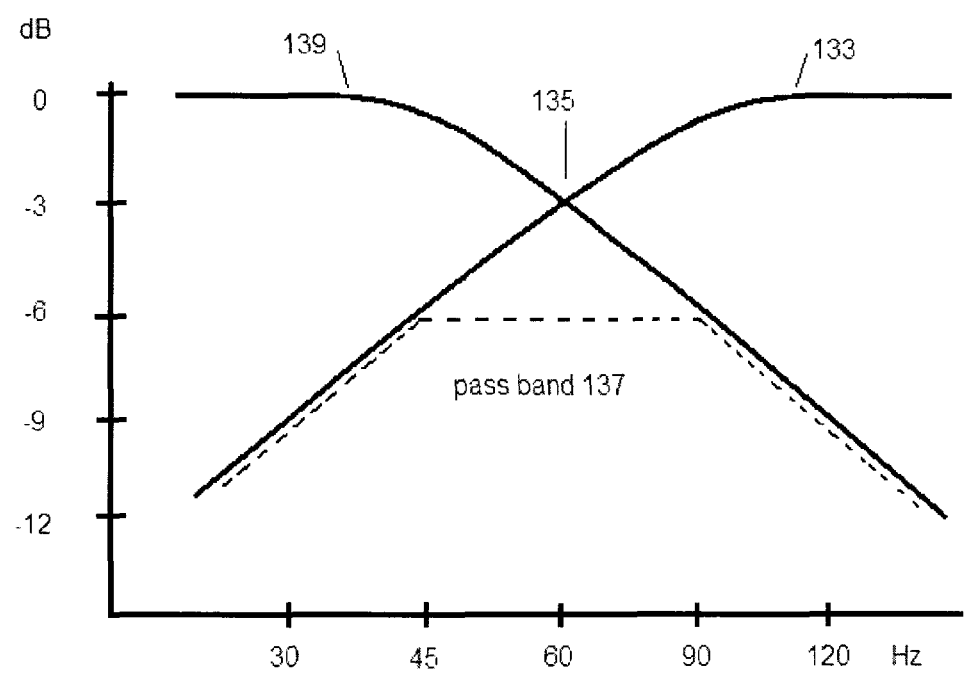

The low pass filter has an attenuation seen curve 139 in FIG. 3, with a −3 dB corner at about the same frequency as the corner 135 of the high pass filter. The attenuated portions (below 0 dB) of the attenuation curves of the high pass filter and the low pass filter overlap. The combined output 137 of the high pass and low pass filters, which is attenuated by perhaps −6 dB, is also shown in FIG. 3.

The circuit 110 in FIG. 2a traces the peaks or upper boundary of the filter output 138. The circuit 110 includes a dual comparator 142, such as a Fairchild LM393 integrated circuit (IC). Though shown as two pieces for explanation purposes, the commercial LM 393 IC is one IC.

The signal 138 is fed into an input 144. An output 146 is biased with a current from a 12 volt power supply, through a resistor 150, to yield about a 25 mV bias voltage. Another reference voltage 152 is provided through a diode 154. The voltage at the input 152 is rectified by the diode 154, and smoothed by a capacitor 156, which in turn is anchored to ground by a resistor 158. The voltage provided at input 152 is also provided to an input 160 of a second comparator in the LM 393 IC.

A resistor 168 is provided between the power supply 148 and the output 174, to provide bias for an output transistor in the LM 393 IC. The capacitor 170 and diode 172 are provided in parallel between a reference voltage input 166 and the ground terminal 131. The capacitor 170 smoothes the output 174, and the diode 172 limits the output 174 to about 600 mV. The output 174 can be control voltage for the analog multiplier/amplifier 112, and can be about 200 mV.

Figure 5:
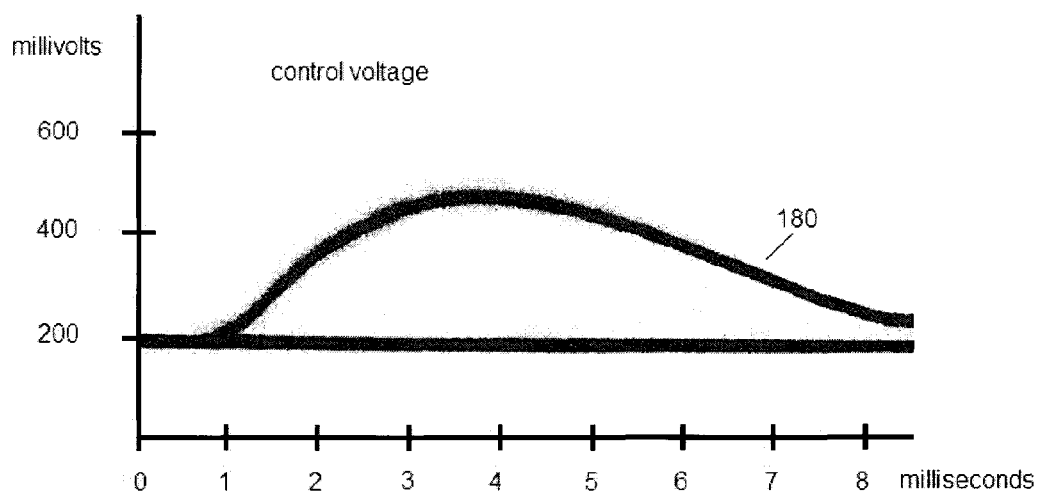

The output 174 can be fed to the smoothing circuit 111, that includes a resistor 176 and capacitors 182,184. The output 180 of the smoothing circuit 111, an example of which is seen in FIG. 5, is the control voltage for the analog multiplier circuit 112.

Figure 2B:
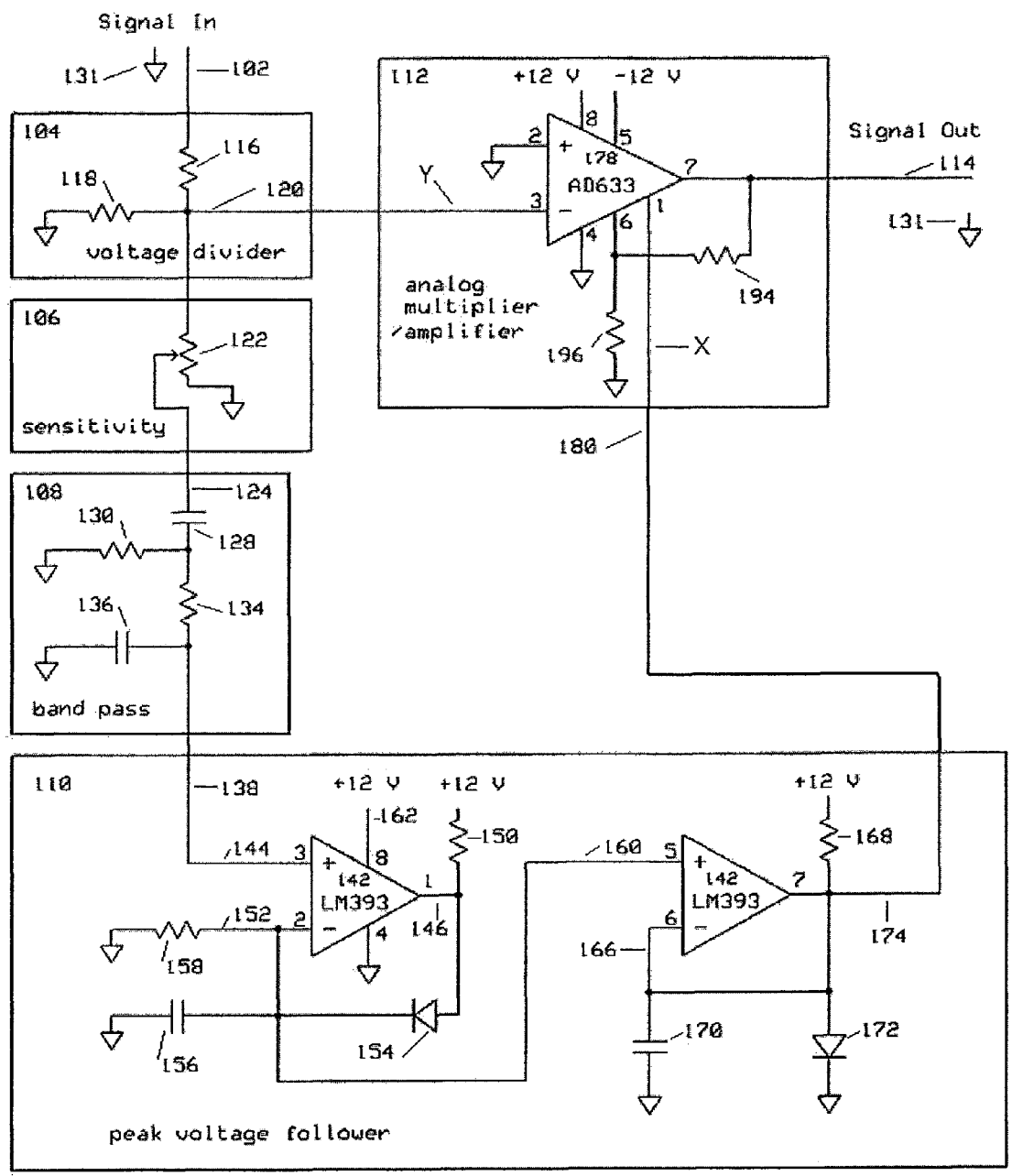

Alternatively, smoothing circuit 111 can be omitted, as seen in a signal conditioner 100a in FIG. 2b, and the output 174 can be the control voltage 180 for the analog multiplier/amplifier 112. The other components in FIG. 2b are the same as the corresponding components in FIG. 2a.

The analog multiplier circuit 112 includes the analog multiplier/operational amplifier 178, which can be an Analog Devices AD633 integrated circuit. The control voltage 180 is a first input X to the analog multiplier circuit 112. The input signal 120 is provided as input Y to the circuit 112. The analog multiplier 178 multiplies the inputs X and Y, divides the combined signal by 10, and provides an output signal to the output terminal 114. A feedback loop is provided through series resistors 194 and 196. The feedback loop adjusts the final output signal level.

Figure 4:
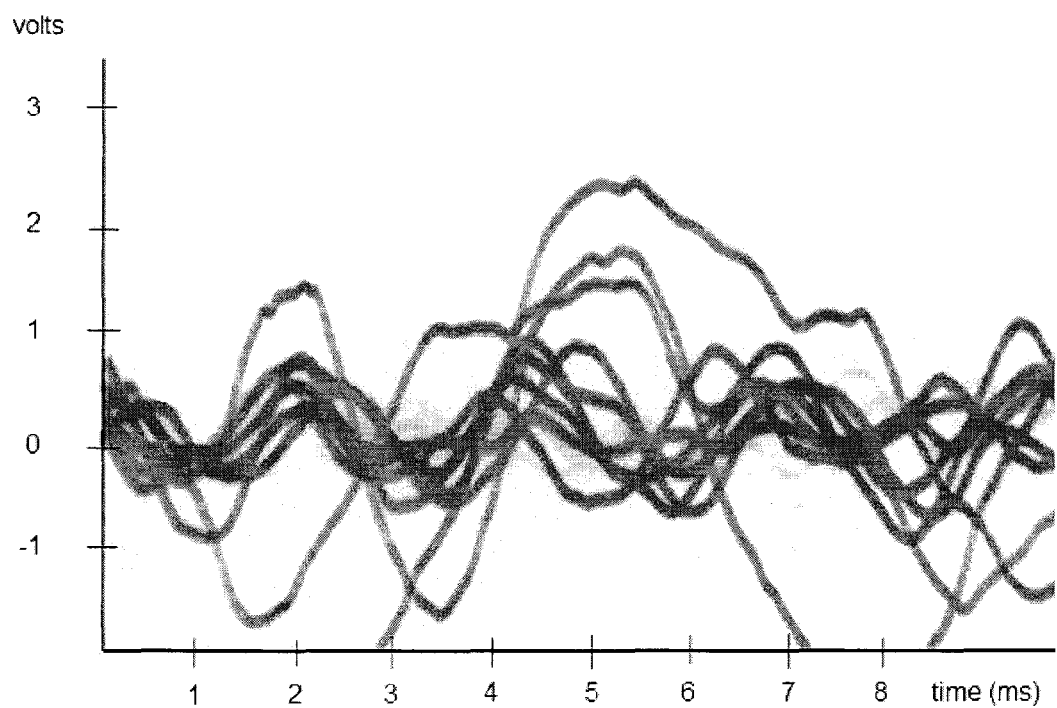

FIG. 4 is an example of a waveform produced by the filter 108, at the input 138 of the circuit 110. The peak voltage follower 110 roughly or generally tracks the peaks seen in FIG. 4. The circuit 110 and voltage smoothing circuit 111 produce the control voltage 180 shown in FIG. 5 from the peaks in FIG. 4.

Figure 6A:
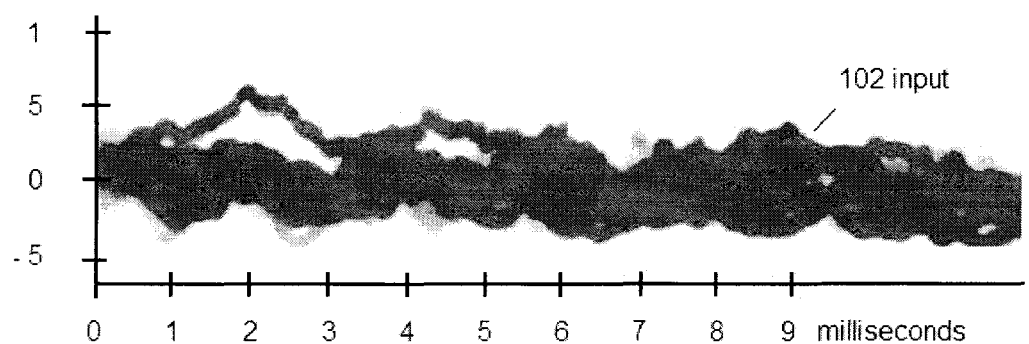
Figure 6B:
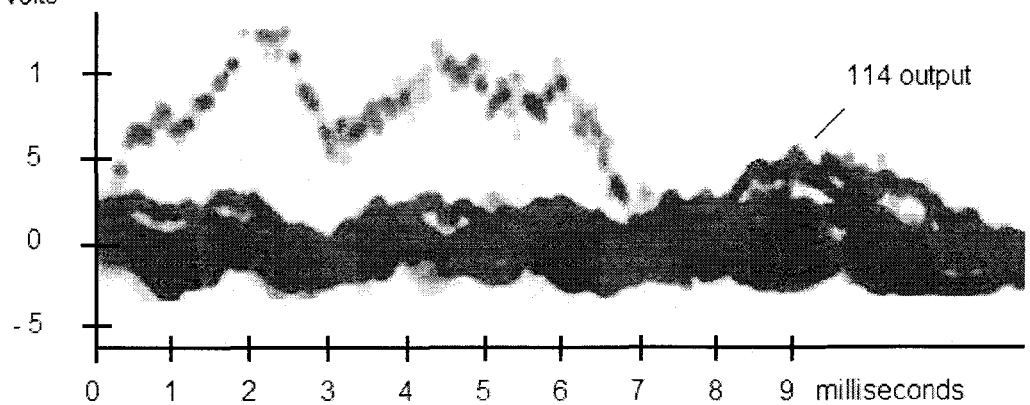

FIG. 6a illustrates the signal input 102, and FIG. 6b illustrates the output signal 114. FIG. 6b shows the boost in the output of the low frequency component of the input signal, representing low frequency percussion instruments, which are best reproduced in subwoofers.

While the principles of the invention have been described above in connection with specific apparatus and applications, it is to be understood that this description is made only by way of example and not as a limitation on the scope of the invention.

What is claimed is:

1. An audio reproduction system comprising:
   an electronic device that reproduces prerecorded content,
   a signal conditioner that magnifies low frequency transients in the reproduced content, and
   a subwoofer having a speaker, the speaker reproducing the content,
   the signal conditioner including:
   an input for a signal from the electronic device;
   a band pass filter which passes a lower frequency spectrum of the input signal,
   the band pass filter including a high pass filter having a first predetermined attenuation curve with a first attenuated portion and a low pass filter having a second attenuation curve with a second attenuated portion, the first and second attenuated portions overlapping;
   the band pass filter producing a filtered input to a peak voltage follower circuit;
   the peak voltage follower circuit tracing and smoothing the upper boundary of the filtered input to produce a control voltage; and
   an analog multiplier that multiplies the input signal by the control voltage produced by the peak voltage follower circuit,
   the output of the multiplier representing an enhanced signal where the low frequency transients have been magnified.

2. The audio reproduction system of claim 1, wherein the signal conditioner comprises a voltage divider and a sensitivity control at an input of the band pass filter.

3. The audio reproduction system of claim 1, wherein the signal conditioner comprises an amplifier that adjusts the multiplier output to a desired final output.

4. The audio reproduction system of claim 1, wherein the high pass filter has a corner frequency and the low pass filter has the same corner frequency.

5. The audio reproduction system of claim 1, wherein the analog multiplier divides the multiplication product produced by the analog multiplier by 10.

6. The audio reproduction system of claim 1, wherein the lower frequency spectrum has a center frequency of about 60 hz.

7. The audio reproduction system of claim 1, wherein the signal conditioner comprises a smoothing circuit that further smoothes the control voltage.

* * * * *